(12) United States Patent
Okumura

(10) Patent No.: US 8,588,269 B2
(45) Date of Patent: Nov. 19, 2013

(54) LASER CRYSTALLIZATION APPARATUS AND LASER CRYSTALLIZATION METHOD USING THE SAME

(75) Inventor: Hiroshi Okumura, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/433,094

(22) Filed: Mar. 28, 2012

(65) Prior Publication Data

US 2013/0094534 A1    Apr. 18, 2013

(30) Foreign Application Priority Data

Oct. 14, 2011    (KR) .................. 10-2011-0105326

(51) Int. Cl.
*H01S 3/121*    (2006.01)
*H01S 3/10*    (2006.01)
*H01S 3/08*    (2006.01)

(52) U.S. Cl.
USPC ........................... 372/107; 372/15; 372/24

(58) Field of Classification Search
USPC .......................... 372/9, 15, 24, 107
See application file for complete search history.

(56) References Cited

U.S. PATENT DOCUMENTS

| | | | |
|---|---|---|---|
| 5,357,365 A | 10/1994 | Ipposhi et al. | |
| 6,768,762 B2 | 7/2004 | Sparrow | |
| 7,232,715 B2 | 6/2007 | Arao et al. | |
| 7,387,922 B2 | 6/2008 | Tanaka et al. | |
| 2011/0097906 A1* | 4/2011 | Kwon et al. | 438/795 |

FOREIGN PATENT DOCUMENTS

| | | |
|---|---|---|
| JP | 2001-297983 A | 10/2001 |
| JP | 2004-063692 A | 2/2004 |
| JP | 2004-103628 A | 2/2004 |
| JP | 2007-208110 A | 8/2007 |
| KR | 10-2011-0008339 A | 1/2011 |
| KR | 10-2011-0046239 A | 5/2011 |

* cited by examiner

*Primary Examiner* — Armando Rodriguez
(74) *Attorney, Agent, or Firm* — Innovation Counsel LLP

(57) ABSTRACT

A laser crystallization device is provided, which includes a vibration device vibrating a laser beam along its long axis, wherein a vibration frequency at which the laser beam vibrates is satisfied by Equation 1 below.

$F<(P*f)/(2*W)$    Equation 1 where F is the mirror vibration frequency, W is the laser beam width, P is the laser scan pitch, and f is the laser pulse frequency.

8 Claims, 7 Drawing Sheets

LASER CRYSTALLIZATION APPARATUS AND LASER CRYSTALLIZATION METHOD USING THE SAME

CROSS-REFERENCE TO RELATED APPLICATION

This application claims priority to and the benefit of Korean Patent Application No. 10-2011-0105326 filed in the Korean Intellectual Property Office on Oct. 14, 2011, the entire contents of which are incorporated herein by reference.

BACKGROUND OF THE INVENTION (a) Field of the Invention

The present invention relates to a laser crystallization device and a laser crystallization method.

(b) Description of the Related Art

Both liquid crystal displays (LCDs) and organic light emitting diode (OLED) displays can be fabricated to be thin and lightweight. These types of flat panel display devices are commonly used as displays in mobile electronic devices, and their application coverage extends to large-scale display devices. As the necessity for display devices requiring high speed operational characteristics emerges, research on such a display device is actively ongoing.

To satisfy the high speed operational characteristics of a display device, the channel region of a thin film transistor (TFT) must be formed by using a material with a greater electrical mobility than that of amorphous silicon, whose electrical mobility is only about 0.1 cm/Vsec to 0.5 cm/Vsec. Polycrystalline silicon has an electrical mobility of about 100 cm/Vsec to 300 cm/Vsec, thereby enabling a much faster operational speed compared with amorphous silicon.

Excimer laser annealing (ELA) is a conventional method for forming polycrystalline silicon. In the ELA crystallization method, an amorphous silicon thin film deposited on a glass substrate is irradiated by a high energy pulsed laser beam. Upon absorbing the light energy from the laser beam, the amorphous silicon thin film melts, and then re-solidifies so as to be crystallized. An advantage of this method is that the glass substrate is not damaged by the heat.

In this laser crystallization method, the spatial energy distribution cross-section, or profile, of the output laser beam, which typically has a Gaussian distribution, is changed by using an optical system. The output beam shape is transformed into a rectangle with a very large aspect ratio. To improve uniformity and productivity of crystallization, the output energy distribution is transformed into a "top-hat" beam profile, which is as nearly uniform as possible over the entire focused rectangular beam, with sharp edges.

During the laser annealing process, if a persistent inhomogeneity appears in the laser beam profile, a corresponding linear pattern may be displayed on the silicon target along the scan direction of the laser. The linear pattern may be subsequently frozen into the polycrystalline silicon.

At this time, if the laser beam profile as the linear pattern may have an error portion, a linear error portion may be generated along a scan direction of the laser.

To prevent the linear error portion, a method of vibrating the focused laser beam along its long axis, perpendicular to the scan direction, has been attempted when forming the polycrystalline silicon thin film. By irradiating the vibrating laser beam onto the amorphous silicon thin film, however, there is a limitation in removing a defect of a dot pattern. This dot pattern inhomogeneity in the laser beam profile may cause undesirable nonuniformities in the polycrystalline silicon.

The above information disclosed in this Background section is only for enhancement of understanding of the background of the invention and therefore it may contain information that does not form the prior art that is already known in this country to a person of ordinary skill in the art.

SUMMARY OF THE INVENTION

The present disclosure provides a laser crystallization device and a laser crystallization method which reduces display error of a dot pattern, and the related silicon polycrystallization nonuniformity.

A laser crystallization device includes a vibration device vibrating a laser beam along the long axis of the focused beam spot, wherein a vibration frequency at which the laser beam vibrates is satisfied by Equation 1 below:

$$F<(P*f)/(2*W) \quad \text{Equation 1}$$

where F is the mirror vibration frequency, W is the laser beam width, P is the laser scan pitch, and f is the laser pulse frequency.

A laser crystallization device according to another aspect includes a vibration device vibrating a laser beam along its long axis of a laser beam with a "top-hat" profile, wherein a vibration frequency at which the laser beam vibrates is satisfied by Equation 2 below:

$$F<(P*f)/Ts \quad \text{Equation 2}$$

where F is the mirror vibration frequency, P is the laser scan pitch, f is the laser pulse frequency, and Ts is the spacing between thin film transistors along the laser beam scan direction.

A vibration frequency at which the laser beam vibrates may be satisfied by Equation 3 below:

$$F<(P*f)/(Ts+W) \quad \text{Equation 3}$$

where F is the mirror vibration frequency, W is the laser beam width, P is the laser scan pitch, f is the laser pulse frequency, and Ts is the spacing between thin film transistors along the laser beam scan direction.

Another vibration frequency at which the laser beam vibrates may be satisfied by Equation 4 below:

$$F<(P*f)/(3*Ts) \quad \text{Equation 4}$$

where F is the mirror vibration frequency, P is the laser scan pitch, f is the laser pulse frequency, and Ts is the spacing between thin film transistors along the laser beam scan direction.

Still another vibration frequency at which the laser beam vibrates may be satisfied by Equation 5 below:

$$F<(P*f)/(3*Ts+W) \quad \text{Equation 5}$$

where F is the mirror vibration frequency, W is the laser beam width, P is the laser scan pitch, f is the laser pulse frequency, and Ts is the spacing between thin film transistors along the laser beam scan direction.

A laser crystallization device according to another implementation includes a vibration device vibrating a laser beam along its long axis, wherein a vibration frequency at which the laser beam vibrates is satisfied by Equation 6 below:

$$F<(3*Tm*P*f)/(2*Ts*A) \quad \text{Equation 6}$$

where F is the mirror vibration frequency, W is the laser beam width, P is the laser scan pitch, f is the laser pulse frequency, Ts is the spacing between thin film transistors along the laser beam scan direction, A is the mirror vibration distance, and Tm is the spacing between thin film transistors in the mirror vibration direction.

A vibration frequency at which the laser beam vibrates may be satisfied by Equation 7 below:

$$F<(Tm*P*f)/(2*Ts*A) \qquad \text{Equation 7}$$

where F is a mirror vibration frequency, W is a laser beam width, P is a laser scan pitch, f is a laser pulse frequency, Ts is the spacing between thin film transistors along the laser beam scan direction, A is a mirror vibration distance, and Tm is the spacing between thin film transistors in the mirror vibration direction.

A vibration frequency at which the laser beam vibrates may be satisfied by Equation 8 below:

$$F<(Tm*P*f)/(6*Ts*A) \qquad \text{Equation 8}$$

where F is a mirror vibration frequency, W is a laser beam width, P is a laser scan pitch, f is a laser pulse frequency, Ts is the spacing between thin film transistors along the laser beam scan direction, A is a mirror vibration distance, and Tm is the spacing between thin film transistors in the mirror vibration direction.

A laser crystallization method includes irradiating a laser on an amorphous silicon substrate by using a laser crystallization device, wherein the laser crystallization device includes a vibration device vibrating a laser beam along its long axis, and a vibration frequency at which the laser beam vibrates is satisfied by Equation 1 below:

$$F<(P*f)/(2*W) \qquad \text{Equation 1}$$

where F is a mirror vibration frequency, W is a laser beam width, P is a laser scan pitch, and f is a laser pulse frequency.

Another laser crystallization method includes irradiating a laser on an amorphous silicon substrate by using a laser crystallization device which includes a vibration device vibrating a laser beam along its long axis, with a vibration frequency at which the laser beam vibrates satisfying Equation 2 below:

$$F<(P*f)/Ts \qquad \text{Equation 2}$$

where F is the mirror vibration frequency, P is the laser scan pitch, f is the laser pulse frequency, and Ts is the spacing between thin film transistors along the laser beam scan direction.

A vibration frequency at which the laser beam vibrates may be satisfied by Equation 3 below:

$$F<(P*f)/(Ts+W) \qquad \text{Equation 3}$$

where F is the mirror vibration frequency, W is the laser beam width, P is the laser scan pitch, f is the laser pulse frequency, and Ts is the spacing between thin film transistors along the laser beam scan direction.

A vibration frequency at which the laser beam vibrates may be satisfied by Equation 4 below:

$$F<(P*f)/(3*Ts) \qquad \text{Equation 4}$$

where F is the mirror vibration frequency, P is the laser scan pitch, f is the laser pulse frequency, and Ts is the spacing between thin film transistors along the laser beam scan direction.

A vibration frequency at which the laser beam vibrates may be satisfied by Equation 5 below:

$$F<(P*f)/(3*Ts+W) \qquad \text{Equation 5}$$

where F is the mirror vibration frequency, W is the laser beam width, P is the laser scan pitch, f is the laser pulse frequency, and Ts is the spacing between thin film transistors along the laser beam scan direction.

Another implementation of the laser crystallization method includes irradiating a laser on an amorphous silicon substrate by using a laser crystallization device with a vibration device vibrating a laser beam along its long axis with a "top-hat" profile, and a vibration frequency at which the laser beam vibrates is satisfied by Equation 6 below:

$$F<(3*Tm*P*f)/(2*Ts*A) \qquad \text{Equation 6}$$

where F is the mirror vibration frequency, P is the laser scan pitch, f is the laser pulse frequency, Ts is the spacing between thin film transistors along the laser beam scan direction, A is the mirror vibration distance, and Tm is the spacing between thin film transistors in the mirror vibration direction.

A vibration frequency at which the laser beam vibrates may be satisfied by Equation 7 below:

$$F<(Tm*P*f)/(2*Ts*A) \qquad \text{Equation 7}$$

where F is the mirror vibration frequency, P is the laser scan pitch, f is the laser pulse frequency, Ts is the spacing between thin film transistors along the laser beam scan direction, A is the mirror vibration distance, and Tm is the spacing between thin film transistors in the mirror vibration direction.

Another vibration frequency at which the laser beam vibrates may be satisfied by Equation 8 below:

$$F<(Tm*P*f)/(6*Ts*A) \qquad \text{Equation 8}$$

where F is the mirror vibration frequency, P is the laser scan pitch, f is the laser pulse frequency, Ts is the spacing between thin film transistors along the laser beam scan direction, A is the mirror vibration distance, and Tm is the spacing between thin film transistors in the mirror vibration direction.

As described above, by considering the focused laser beam width, the laser scan pitch, the laser pulse frequency, and the target spacings between adjacent thin film transistors, the vibration frequency constraints of the laser crystallization device may be calculated. By vibrating the laser beam in the calculated frequency range, the regions on the target where multiple pulses overlap constructively may be minimized, such that the display error of the dot pattern may be reduced. The polycrystalline silicon so produced shows improved uniformity, with resultant benefits for device manufacture.

DETAILED DESCRIPTION OF THE EMBODIMENTS

Figure 1:
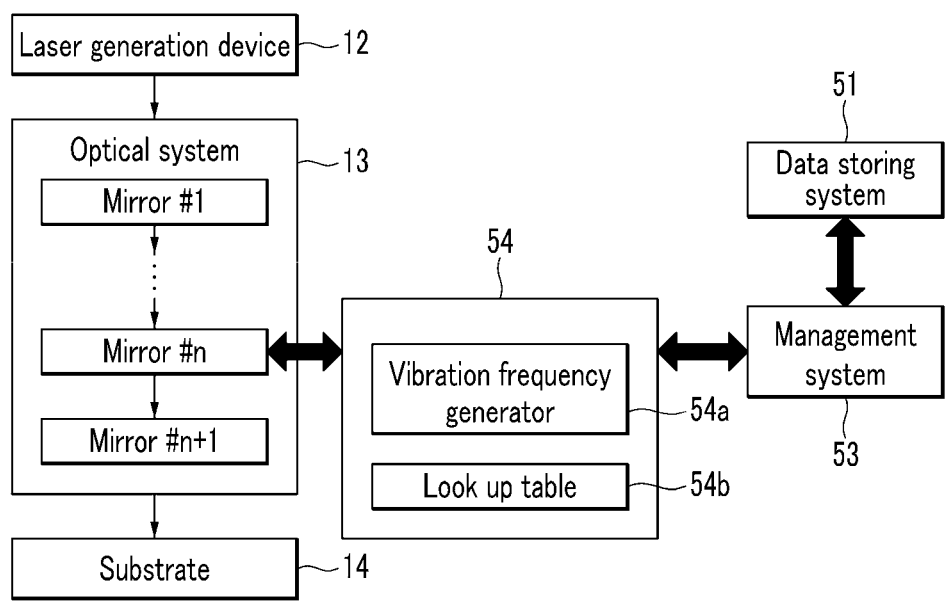
FIG. 1 is a block diagram of a laser crystallization system according to an exemplary embodiment of the present invention.

Exemplary embodiments of the present invention are described in detail with reference to the accompanying drawings. The present invention is not limited to exemplary embodiments described herein, however, but may be embodied in other forms. As one example, optics in the schematic diagrams may often be replaced with their reflective, refractive, or diffractive counterparts to give a similar result. Rather, exemplary embodiments described herein are provided to thoroughly and completely understand the disclosed contents and to sufficiently transfer the ideas of the present invention to a person of ordinary skill in the art.

In the drawings, the thickness of layers and regions are exaggerated for clarity. It is to be noted that when a layer is referred to as being "on" another layer or substrate, it can be directly formed on another layer or substrate or can be formed on another layer or substrate through an intervening third layer. Like constituent elements are denoted by like reference numerals throughout the specification. Inequalities may be labeled as Equations, where the mathematical operator expresses its plain meaning.

Firstly, a laser crystallization system and a vibration frequency generation method of a laser beam according to an exemplary embodiment of the present invention will be described with reference to FIG. 1 and FIG. 2.

FIG. 1 is a block diagram of a laser crystallization system according to an exemplary embodiment of the present invention.

Referring to FIG. 1, a laser crystallization system according to the present exemplary embodiment includes a laser generation device 12 generating a laser beam, an optical system 13, a substrate 14, a vibration frequency controller 54, a data storing system 53, and a management system 51.

The optical system 13 changes the energy distribution and direction of a pulsed laser beam and focuses it onto the substrate 14.

The vibration frequency controller 54 controls a frequency to vibrate at least one mirror of the optical system 13. The vibration frequency controller 54 includes a vibration frequency generator 54a generating a frequency under a predetermined vibration frequency generation condition, and a lookup table 54b storing the generated frequency.

The data storing system 53 may store the generated frequency in the vibration frequency generator 54a and monitor the generated vibration frequency through the management system 51.

Next, the structure of a silicon crystallization system according to another exemplary embodiment of the present invention will be described with reference to FIG. 2 to FIG. 4 in detail.

Figure 2:
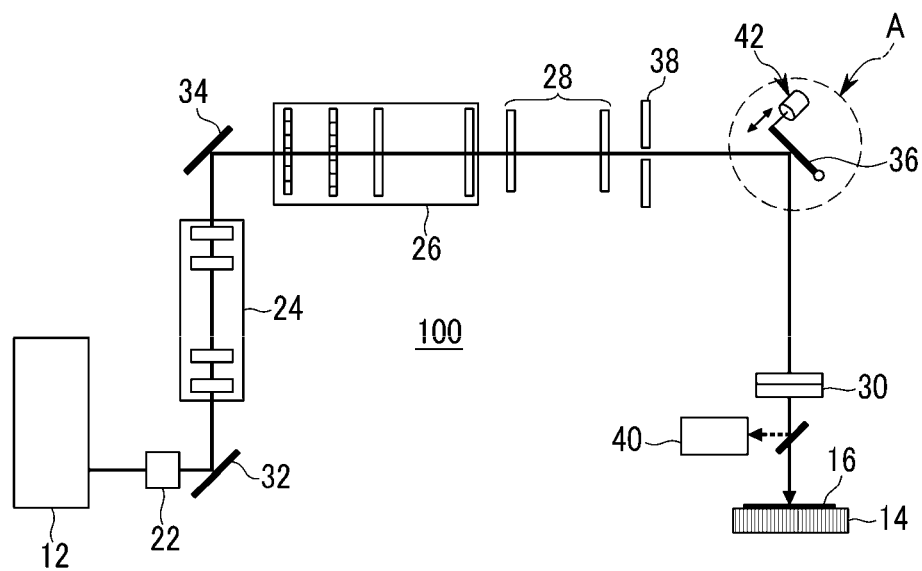
FIG. 2 is a schematic diagram of a laser crystallization system according to an exemplary embodiment of the present invention.

FIG. 2 is a schematic diagram of the basic laser crystallization system according to an exemplary embodiment. FIG. 3 is a schematic diagram of a substrate irradiated with a laser beam from the laser crystallization system shown in FIG. 2, with a movement stage supporting the substrate. And FIG. 4 is an enlarged view of region A shown in FIG. 2.

Referring to FIG. 2, the silicon crystallization system 100 includes the laser generation device 12; an optical system through which the laser beam passes; and the target thin film-coated substrate on its stage. The optical system changes the energy distribution, or cross-sectional intensity profile, of the pulsed laser beam generated from the laser generation device 12 into a rectangular, or "top-hat" profile, and focuses the laser beam onto an amorphous silicon thin film 16 on the substrate 14. Before describing the components of the optical system in detail, the silicon crystallization process using the laser beam with a rectangular profile will be described with reference to FIG. 3.

Figure 3:
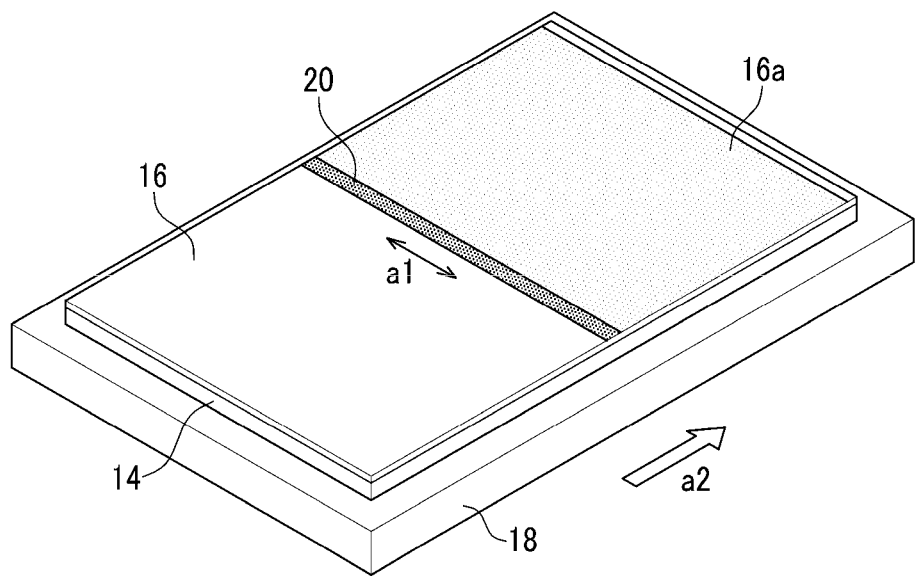
FIG. 3 is a schematic diagram of a substrate irradiated by a laser beam from the laser crystallization system shown in FIG. 2 with a movement stage supporting the substrate.

FIG. 3 depicts the substrate 14 including the amorphous silicon thin film 16 fixed on a movement stage 18. The amorphous silicon thin film 16 is heated with the focused laser beam 20 that has been changed into a rectangular profile through the optical system. The long axis dimension of the laser beam 20 focused onto the amorphous silicon thin film 16 is indicated by the arrow a1.

The position of the laser beam 20 is fixed, and the movement stage 18 is moved in the arrow direction a2. By the movement of the movement stage 18, the laser beam 20 scans over the amorphous silicon thin film 16 in the direction opposite to a2, and the molten silicon in the heated region 20 crystallizes as polycrystalline silicon in the region 16a upon cooling. The "laser beam scan direction," as used herein, is the direction opposite to the arrow a2; because in the frame of reference of the silicon surface, that "laser beam scan direction" is the direction the focused laser beam scans across the surface in the absence of any vibration.

In this process, the laser beam 20 focused onto the amorphous silicon thin film 16 would ideally have a uniform energy distribution along both the beam width W and the long axis direction a1. The beam, however, has a non-uniform energy distribution as a characteristic of the laser and of the static optical system.

The silicon crystallization system 100 of FIG. 2 provides a varying vibration to a mirror of the optical system such that the laser beam 20 may be moved along its long axis direction a1 with predetermined amplitude. Thus the non-uniform energy distribution of the laser beam 20 along a1 is averaged such that the laser beam's heating dose may be corrected.

Again referring to FIG. 2, in the silicon crystallization system 100 of the present exemplary embodiment, the optical system includes an energy attenuator 22, a telescopic lens unit 24, a homogenizer lens array 26, a first lens group 28, and a second lens group 30 sequentially positioned from the laser generation device 12.

The homogenizer lens array 26 divides an output laser beam generally having a Gaussian energy distribution into a plurality of laser beams along one direction.

Furthermore, the first lens group 28 and the second lens group 30 cause the plurality of laser beams that have been divided by the homogenizer lens array 26 to overlap, focusing the rectangular laser beam 20 to be elongated along the much longer-axis direction a1. The optical system includes at least one turning mirror (e.g., 32, 34, 36) to reduce the longest dimension of the silicon crystallization system 100 and to obtain a required laser beam path.

In this exemplary embodiment, a first turning mirror 32 is positioned between the energy attenuator 22 and the telescopic lens unit 24, a second turning mirror 34 is positioned between the telescopic lens unit 24 and the homogenizer lens array 26, and a third vibrating turning mirror 36 is positioned between the first lens group 28 and the second lens group 30. The number and the position of the mirrors, however, are not limited thereto and various changes are possible.

A mask 38 having a slit is disposed between the first lens group 28 and the third mirror 36 to block transmission of the unfocused laser beam. A camera 40 installed between the second lens group 30 and the substrate 14 allows an operator to observe the beam intensity profile.

In the optical system described above, a vibration device 42 is installed on one of the first, second, or third turning mirrors (32, 34, or 36, respectively) to vibrate the laser beam 20 along the longer-axis direction a1. In the present exemplary embodiment, the vibration device 42 is installed on the third mirror 36 positioned next to the homogenizer lens array 26. In this scheme, the position of the third turning mirror 36 is most sensitive to the path of the magnified, homogenized laser beam among the first, second, and third mirrors 32, 34, and 36. However, the present invention is not limited thereto.

Figure 4:
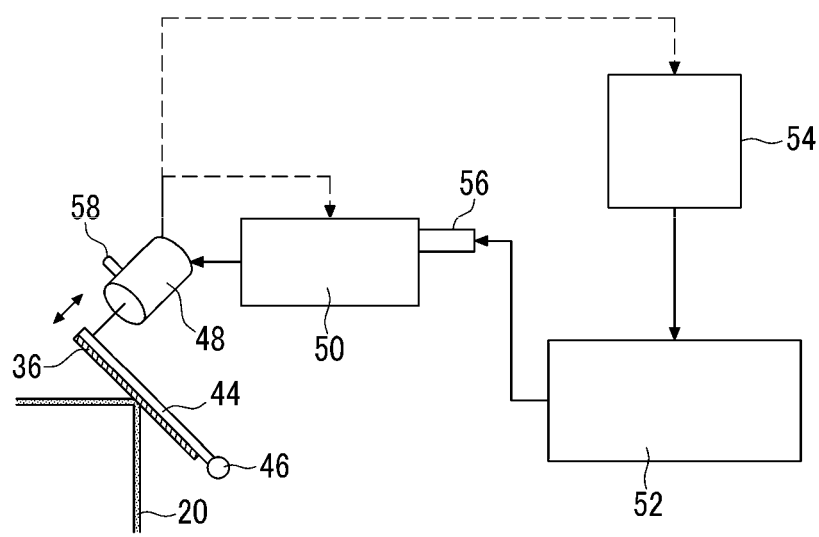
FIG. 4 is an enlarged view of a region A shown in FIG. 2.

With reference to FIG. 4, the third mirror 36 is fixed to a support 44, and a fixing shaft 46 is installed at one end of the support 44. The third mirror 36 may be rotated centered on the fixing shaft 46.

The vibration device 42 includes a vibration operator 48 fixed to the other end of the support 44 to reciprocally move the end of the third mirror 36; a controller 50 including a driver for driving the vibration operator 48; a pulse generator 52 generating a drive signal of the vibration operator 48; and a vibration frequency controller 54 controlling the drive signal generated by the pulse generator 52. A precise operator suitable for driving of a small displacement, such as a piezoelectric driver, may be used as the vibration operator 48.

The drive signal generated by the pulse generator 52 is inputted to the controller 50, and the vibration operator 48 is driven by the driver of the controller 50. The vibration frequency controller 54 generates the vibration frequency of the drive signal generated by the pulse generator 52 according to certain constraints specified herein, and the pulse generator 52 generates the drive signal matching the vibration frequency sent from the vibration frequency controller 54. That is, the vibration frequency controller 54 may modulate both the amplitude and period of the drive signal generated by the pulse generator 52 such that both fit certain conditions, or the vibration frequency controller 54 may modulate either one of the amplitude or the period.

A filter 56 may be mounted to prevent generation of an abnormal pulse caused by a change in the vibration frequency, and thereby prevent damage to the vibration operator 48. A sensor 58 may be installed to the vibration operator 48 or to the support 44. The movement of the vibration operator 48 may be monitored, or feedback control may be performed by the controller 50 and the vibration frequency controller 54 using a signal generated by the sensor 58.

To generate the vibrational frequency as described above, the frequency may be randomly changed during a chosen time period based on a center frequency. The variation of the vibration frequency may be set to have a certain range differing from the center frequency.

The vibration operator 48 vibrates at a vibrational frequency that is randomly generated within the predetermined range during the chosen time period. When the third mirror 36 is caused to vibrate, the focused laser beam 20 also vibrates at the vibrational frequency which randomly changes during the chosen time period along the longer-axis direction a1. By judicious choice of the vibrational frequencies, the silicon crystallization system 100 can prevent generation of periodic patterns on the target display device including on the polycrystalline silicon thin film.

Anomalous reflections from remnants of the periodic patterns are reduced, and visibility of the remnants may be reduced to eyes of an observer.

Figure 5:
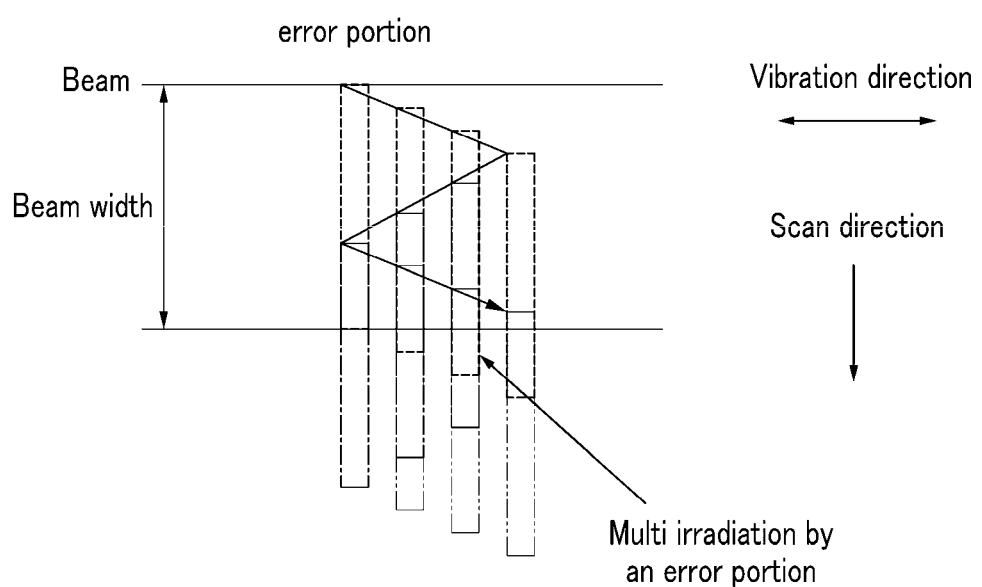
FIG. 5 is a schematic diagram showing a multi-pulse overlap phenomenon by an inhomogeneous portion of a laser beam when irradiating a laser beam onto a substrate according to an aspect of FIG. 1.

FIG. 5 is a schematic diagram showing a multi-pulse irradiation phenomenon by an error portion of a laser beam when focusing the beam onto a substrate according to the exemplary embodiment of FIG. 1. To determine an appropriate vibration frequency such that the aforementioned display error of a linear pattern may be reduced, one need consider the laser scan distance and the laser pulse frequency. Nevertheless, the display error due to the defect of the dot pattern may be generated. In other words, the laser's error portion may be multiply pulsed at the same position according to a relation of the length of the short axis of the laser beam, the scan pitch of the laser beam, the laser pulse frequency, and the chosen vibration frequency. Worse, when multiple pulses of the laser beam's error portion overlap on a target position of a thin film transistor, the display error of the spot pattern may be generated. And even when multiple overlapping pulses of the laser's error portions are not focused onto the target position of a thin film transistor, if neighboring thin film transistors correspond to the laser beam's error portion, a group of dot defects may be formed.

Figure 6:
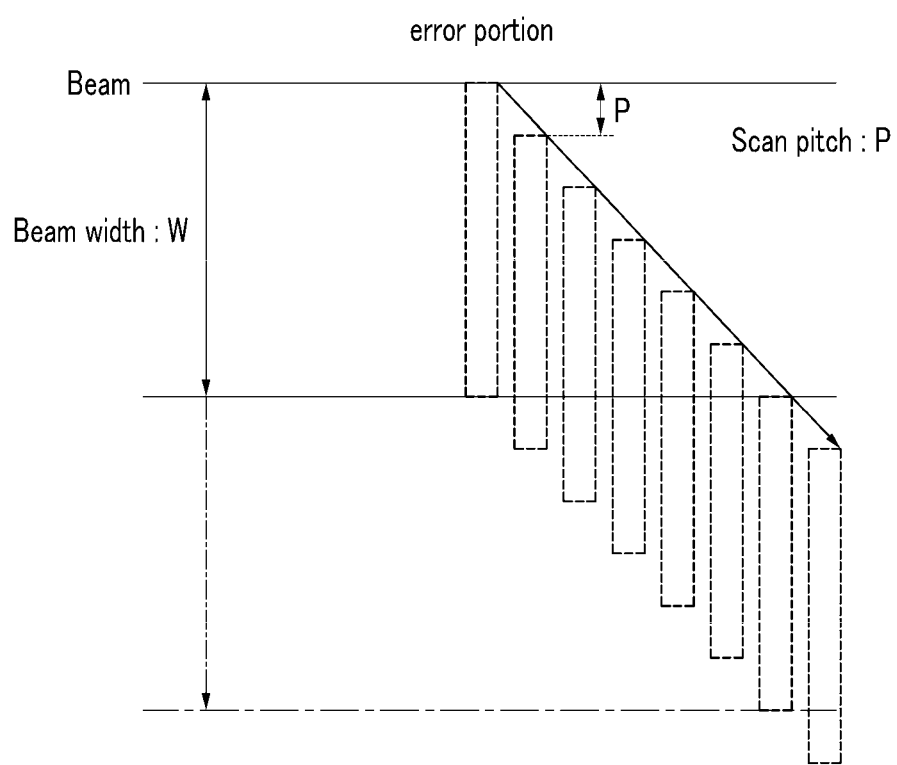
FIG. 6 is a schematic diagram of a pattern generated by irradiating a laser beam error portion using the laser crystallization device scanned according to a vibrational frequency condition of the present invention.

Another exemplary embodiment of the present invention to reduce the display error of the dot pattern will be described with reference to FIG. 6 to FIG. 8. The error portion of the laser beam may be an uneven region in a laser beam profile. FIG. 6 is a schematic diagram of a pattern irradiated by a laser beam's error portion under laser crystallization by using the laser crystallization device according to another exemplary embodiment. The laser crystallization device includes a vibration device, the vibration frequency of the vibrating laser beam satisfying Equation 1 below:

$$F < (P*f)/(2*W) \qquad \text{Equation 1}$$

where F is the mirror vibration frequency, W is the laser beam width, P is the laser scan pitch, and f is the laser pulse frequency.

Equation 1 is derived by equating the time required for the laser beam to scan by its width W, which is W/(P*f), with half of a vibrational period, 1/(2*F). In half of one vibrational period the beam may swing from one end of its vibrational path along a1 to the opposite end of its vibrational path.

To avoid irradiating the laser beam's error portion more than three times requires that the focused beam swings less than its full amplitude A along the a1 direction while the laser beam moves by its width W along the perpendicular scan direction. To state the requirement differently, the laser beam must vibrate less than one full period during the time the laser beam is scanned by its beam width along the scan direction. Accordingly, a W/(P*f)<1/(2*F) condition must be satisfied. If this condition is solved for F, Equation 1 is obtained. On one end of the vibration, a position exists where the error portions are pulsed twice regardless of the mirror vibration frequency. When Equation 1 is satisfied, however, the error portion is not irradiated more than three times on the same position.

Figure 7:
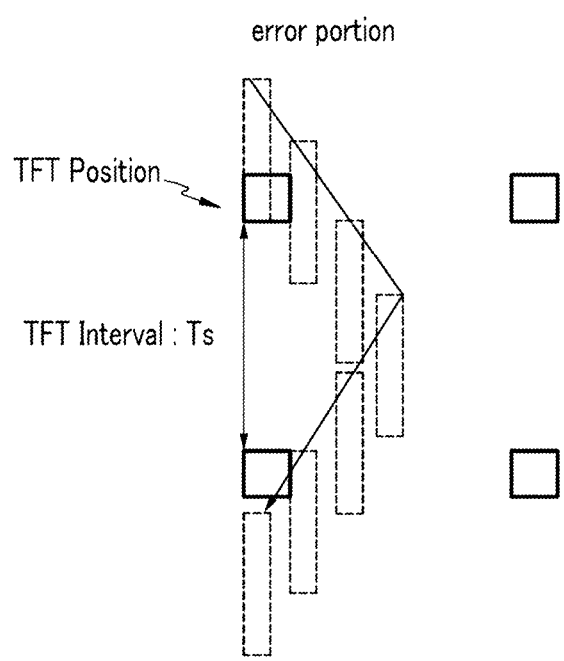
FIG. 7 is a schematic diagram of a pattern irradiated by an inhomogeneous laser beam by using the laser crystallization device considering the spacings along the scan direction between target TFTs in the display device.

FIG. 7 is a schematic diagram of a pattern irradiated by a laser beam's error portion under laser crystallization by using laser crystallization device according to another exemplary embodiment of the present invention. With reference to FIG. 7, a condition can be derived such that the laser beam's error portion does not irradiate target positions of vertically neighboring (i.e., adjacent along the beam scan direction) thin film transistors.

When Ts is the spacing between adjacent thin film transistors in the laser beam scan direction, the same laser beam's error portion may irradiate the target position for neighboring thin film transistors if Ts/(P*f)=1/F. Here Ts/(P*f) is the time interval required for the error portion of the laser beam to scan from the target position of the upper TFT to the target position of the lower TFT along the scan direction in FIG. 7; and 1/F is one vibrational period of the laser beam's error portion. Each boldface rectangle in FIG. 7 indicates a position where a thin film transistor will be formed.

To avoid the laser beam's error portion irradiating the positions where thin film transistors neighboring each other are formed, the vibration frequency of the laser crystallization device according to the present exemplary embodiment satisfies Equation 2 below:

$$F<(P*f)/Ts \qquad \text{Equation 2}$$

where F is the mirror vibration frequency, P is the laser scan pitch, f is the laser pulse frequency, and Ts is the spacing between thin film transistors along the laser beam scan direction.

As a variation of the above-described exemplary embodiment, the vibration frequency vibrating the laser beam may be satisfied by Equation 3 below:

$$F<(P*f)/(Ts+W) \qquad \text{Equation 3}$$

where W indicates the laser beam width, and fine laser irradiation is further possible by adjusting the laser beam width.

The laser crystallization device according to an exemplary embodiment of the present invention may be applied to a display device which includes color filters. In particular, for the case in which the pixel structure of the display device is a vertically-striped RGB structure, forming one pixel for every three thin film transistors requires replacing Ts in Equation 2 by (3*Ts) or by (3*Ts+W). In other words, the vibration frequency of the laser crystallization device according to another exemplary embodiment of the present invention satisfies Equation 4 or Equation 5 below.

$$F<(P*f)/(3*Ts) \qquad \text{Equation 4}$$

$$F<(P*f)/(3*Ts+W) \qquad \text{Equation 5}$$

Figure 8:
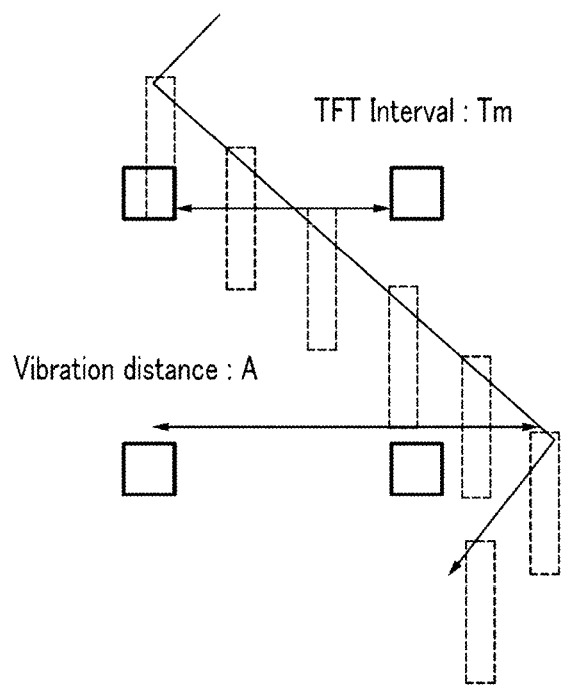
FIG. 8 is a schematic diagram of a pattern irradiated by an inhomogeneous laser beam as crystallized using the laser crystallization device, with laser beam vibration frequencies selected considering the spacings in both dimensions between diagonal TFTs on the display device.

FIG. 8 is a schematic diagram of a pattern irradiated by a laser beam's error portion under laser crystallization by using the laser crystallization device according to another exemplary embodiment. For this case the condition must be obtained in which the laser beam's error portion is irradiated on a position where the diagonally neighboring thin film transistors will be formed.

When the distance that the mirror is vibrated is A, and the spacing of thin film transistors along the vibration direction a1 of the mirror is Tm, the same laser beam's uneven region may be irradiated onto the position where the diagonally neighboring thin film transistors will be formed if Ts/(P*f)=Tm/(2*A*F). Ts/(P*f) is the time interval required for the error portion of the laser beam to reach the target position of the lower thin film transistor from the target position of the upper thin film transistor along the (vertical) scan direction in FIG. 8; and Tm/2*A*F) is the time interval required for the laser beam's error portion to reach the target position of the thin film transistor neighbor to the right. Hence the vibration frequency of the laser crystallization device according to the present exemplary embodiment satisfies Equation 6 below for the laser beam's error portion to miss the position where the thin film transistors neighbor in the diagonal direction:

$$F<(Tm*P*f)/(2*Ts*A) \qquad \text{Equation 6}$$

where F is the mirror vibration frequency, P is the laser scan pitch, f is the laser pulse frequency, Ts is the spacing between thin film transistors along the laser beam scan direction, A is the mirror vibration distance, and Tm is the spacing between thin film transistors in the mirror vibration direction.

The laser crystallization device according to an exemplary embodiment of the present invention may be applied to a display device which includes color filters. In particular, for the case in which the pixel structure of the display device is a vertically-striped RGB structure, forming one pixel for every three thin film transistors requires replacing Ts by (3*Ts), or Tm is replaced by (3*Tm) in Equation 6. So the mirror vibration frequency in the laser crystallization device according to this embodiment may satisfy Equation 7 or Equation 8 below.

$$F<(Tm*P*f)/(6*Ts*A) \qquad \text{Equation 7}$$

$$F<(3*Tm*P*f)/(2*Ts*A) \qquad \text{Equation 8}$$

In the laser crystallization method according to another exemplary embodiment of the present invention, the laser may be irradiated onto the amorphous silicon substrate by using the laser crystallization device described above.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

<Description of Symbols>

| | |
|---|---|
| 100: silicon crystallization system | 12: laser generation device |
| 13: optical system | 14: substrate |
| 16: amorphous silicon thin film | 18: movement stage |
| 20: laser beam | 22: energy attenuator |
| 24: telescopic lens unit | 26: homogenizer lens array |
| 28: first lens group | 30: second lens group |
| 32, 34, 36: mirror | 40: camera |
| 42: vibration device | 44: support |
| 46: fixing shaft | 48: vibration operator |
| 50: controller | 52: pulse generator |
| 54: vibration frequency controller | 56: filter |
| 58: sensor | |

What is claimed is:

1. A laser crystallization device comprising:
a laser beam generating device generating a laser beam;
a mirror positioned in a path of the laser beam; and
a vibration device vibrating the mirror at a mirror vibration frequency to vibrate the laser beam along a long axis of the laser beam,
wherein the mirror vibration frequency is satisfied by Equation 1 below:

$$F<(P*f)/(2*W) \qquad \text{Equation 1}$$

wherein F is the mirror vibration frequency, W is a width of the laser beam, P is a scan pitch of the laser beam along a substrate, and f is a pulse frequency of the laser beam.

2. A laser crystallization device comprising:
a laser beam generating device generating a laser beam;
a mirror positioned in a path of the laser beam;
a vibration device vibrating the mirror at a mirror vibration frequency to vibrate the laser beam along a long axis of the laser beam; and
a substrate including thin film transistors positioned along a scan direction of the laser beam,
wherein the mirror vibration frequency is satisfied by Equation 2 below:

$$F<(P*f)/Ts \qquad \text{Equation 2}$$

wherein F is the mirror vibration frequency, P is a scan pitch of the laser beam along the substrate, f is a pulse frequency of the laser beam, Ts is a spacing between thin film transistors along the scan direction.

3. The laser crystallization device of claim 2, wherein the mirror vibration frequency is satisfied by Equation 3 below:

$$F < (P*f)/(Ts+W) \qquad \text{Equation 3}$$

wherein W is a width of the laser beam.

4. The laser crystallization device of claim 2, wherein the mirror vibration frequency is satisfied by Equation 4 below:

$$F < (P*f)/(3*Ts). \qquad \text{Equation 4}$$

5. The laser crystallization device of claim 2, wherein the mirror vibration frequency is satisfied by Equation 5 below:

$$F < (P*f)/(3*Ts+W) \qquad \text{Equation 5}$$

wherein W is a width of the laser beam.

6. A laser crystallization device comprising
a laser beam generating device generating a laser beam;
a mirror positioned in a path of the laser beam;
a vibration device vibrating the mirror at a mirror vibration frequency to vibrate the laser beam along a long axis of a laser beam, and
a substrate including thin film transistors positioned along a scan direction of the laser beam,
wherein the mirror vibration frequency is satisfied by Equation 6 below:

$$F < (3*Tm*P*f)/(2*Ts*A) \qquad \text{Equation 6}$$

wherein F is the mirror vibration frequency, P is a scan pitch of the laser beam along the substrate, f is a pulse frequency of the laser beam, Ts is a spacing between thin film transistors along the scan direction, A is a mirror vibration distance, Tm is a spacing between thin film transistors in a mirror vibration direction.

7. The laser crystallization device of claim 6, wherein the mirror vibration frequency is satisfied by Equation 7 below:

$$F < (Tm*P*f)/(2*Ts*A). \qquad \text{Equation 7}$$

8. The laser crystallization device of claim 6, wherein the mirror vibration frequency is satisfied by Equation 8 below:

$$F < (Tm*P*f)/(6*Ts*A). \qquad \text{Equation 8}$$

* * * * *